US008759666B2

(12) United States Patent
Evans

(10) Patent No.: US 8,759,666 B2
(45) Date of Patent: Jun. 24, 2014

(54) WAVELENGTH CONVERSION PHOTOVOLTAICS

(75) Inventor: Matthew H. Evans, Lancaster, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 599 days.

(21) Appl. No.: 12/388,699

(22) Filed: Feb. 19, 2009

(65) Prior Publication Data

US 2010/0206359 A1 Aug. 19, 2010

(51) Int. Cl.
*H01L 31/042* (2014.01)
*H01L 31/00* (2006.01)

(52) U.S. Cl.
USPC .............................. 136/250; 136/255; 136/252

(58) Field of Classification Search
CPC .................. H01L 31/18; H01L 31/042; H01L 2223/6677; Y02B 60/50; H02J 17/00
USPC ......... 136/243, 244, 246, 247, 248, 250, 253, 136/255, 257, 292
See application file for complete search history.

(56) References Cited

U.S. PATENT DOCUMENTS

| 6,882,128 | B1 * | 4/2005 | Rahmel et al. ................. 320/101 |
| 2002/0162995 | A1 | 11/2002 | Petroff et al. |
| 2004/0182431 | A1 * | 9/2004 | Zuppero et al. ............... 136/243 |
| 2005/0284147 | A1 * | 12/2005 | Allen et al. ................... 60/641.8 |
| 2006/0169971 | A1 | 8/2006 | Cho et al. |
| 2008/0230782 | A1 | 9/2008 | Antoniadis et al. |

FOREIGN PATENT DOCUMENTS

| DE | 102005018820 A1 | 11/2006 |
| WO | WO 2005038997 A2 * | 4/2005 |

OTHER PUBLICATIONS

Moreau, E., Manin, R.L., Thierry-Mieg, V., Gerard, J.M., Abram, I., "Quantum Cascade of Photons in Semiconductor Quantum Dots", Physical Review Letters, vol. 87, 2001, p. 183601-1-183601-4.*
Tenne, D.A., Milekhin, A.G., Bakarov, A.k., Bajutova, O.R., Haisler, V.A., Toropov, A.I., Schulze, S., Zahn, D.R.T., "Raman spectroscopy of self-assembled InAs quantum dots in wide-bandgap matrices of AlAs and aluminum oxide", Mat. Res. Soc. Symp. Proc., 2003, vol. 737 E13.8.1.*
B. Strassner, "5.8 GHz Circularly Polarized Dual-Rhombin-Loop Traveling-Wave Rectifying Antenna for Low Power-Density Wireless Power Trasnmission Applications", IEEE Transactions on Microwave theory and Techniques, vol. 51, May 2003, p. 1548-1553.*

(Continued)

*Primary Examiner* — Jennifer Michener
*Assistant Examiner* — Marla D McConnell
(74) *Attorney, Agent, or Firm* — McDermott Will & Emery LLP

(57) ABSTRACT

An apparatus includes a photovoltaic device (PVD) having a quantum dot (QD) array structure that is capable of performing wavelength conversion. The PVD is configured to generate charge carriers from incident photons. An electric field generator is operable to apply an electric field to the PVD. Strength of the electric field is sufficient to cause the charge carriers to transition through a plurality of discrete energy states formed within a corresponding one of a conductive band and a valence band of the QD array structure. The transition of the charge carriers through the plurality of discrete energy states enables the PVD to generate emitted photons being radiated as an electromagnetic wave. A frequency (and hence wavelength) of the emitted photons being radiated as the electromagnetic wave is tunable by configuring physical attributes of the QD array structure and controlling the electric field strength.

18 Claims, 4 Drawing Sheets

(56) References Cited

OTHER PUBLICATIONS

A. Vardi, N. Akopian, G. Bahi, L. Doyennette, M. Tchernycheva, L. Nevou, F.H. Julien, F. Guillot, E. Monroy, "Room temperature demonstration of GN/AlN quantum dot intraband photodetector at fiber-optics communication wavelength", Applied Physics Letter, 88, 143101 (2006) p. 1431010-1 to 1431001-3.*

Siegel, "Microrectenna: A Terahertz Antenna and Rectifier on a chip" NASA Tech Briefs, Sep. 2007, p. 14-15.*

Honsberg, et al., "Nanostructured Solar Cells for High Efficiency Photovoltaics", Conference Record of the 2006 IEEE 4th World Conference on Photovoltaic Energy Conversion, IEEE, May 1, 2006.

* cited by examiner

WAVELENGTH CONVERSION PHOTOVOLTAICS

BACKGROUND

Many types of transport vehicles (including vehicles for land, sea, air, or space travel) are being adapted for new and innovative applications in the field of commercial and military transportation systems. For example, station-keeping lighter-than-air airships (LTA) have been proposed to replace cell towers for wireless telephone and data systems. Military applications include use of high-altitude airship stations having electronic equipment for performing surveillance, intelligence gathering, radar, navigation, and similar other functions. In many such applications, long-duration station-keeping is essential. Thus, the airship must be equipped to provide power in a sustainable and reliable manner to operate payloads and power on-board systems while simultaneously making headway into the wind in order to hold a fixed geostationary position for desired time duration.

Solar cells capable of converting solar energy to electrical current are being used for powering some of the transport vehicles. In a traditional solar cell, energy from visible light that is incident on a photovoltaic cell is harvested by absorbing photons to generate charge carriers, e.g., holes and electrons, and then separating the charge carriers to drive a direct current (DC) to the electrodes of the solar cell. In a working solar cell, the charge carriers such as electrons must travel out of the solar cell and into an external electrical circuit, e.g., a load, to establish a current flow. Some of the electrons generated by the photons may be recaptured by holes before reaching the electrodes, thereby limiting the performance of the solar cell. Thus, providing a sustainable mechanism for the collection and physical transport of charge carriers is essential for the solar cell to operate reliably and efficiently.

Visible light corresponds to a wavelength of about 400 nanometers (violet color) to about 700 nanometers (red color). Many traditional solar cells are capable of absorbing energy from the visible light but are not capable of absorbing energy from other sources such as heat radiation. Heat radiation and blackbody radiation from the earth is continuous, day and night, with most of the energy in the wave length ranging from approximately 8 microns to approximately 40 microns, which may be up to 100× greater than the wavelengths of the visible light. Photons having less energy than a band gap (which defines the energy required to promote an electron from the valence band to the conduction band) for the material used in the solar cell pass through without being absorbed, while photons having energy higher than the band gap are absorbed, but their excess energy is wasted, e.g., typically dissipated as heat or vibrations.

Another challenge facing many traditional solar cells used in transport vehicles is low operating voltages. That is, many traditional solar cells have a low operating voltage, e.g., 2 volts or less, the voltage being limited by the energy of the incident photon. Voltage drops of 0.4 volts or higher within the solar cells may further limit the traditional solar cell to harvest energies of 0.4 eV or higher (obtainable from mid-infrared to visible light waves). Thus, the traditional DC current based solar cells may be able to harvest energy from heat or energy sources above approximately 600 degrees Celsius. Power-generating photovoltaic cells are not currently available that can deliver sustainable electrical power at a desirable voltage from energy sources operating at or below approximately 600 degrees Celsius. If such cells could be made, they could potentially supply the transports such as the high-altitude airship from the earthshine alone, continuously, day and night, without the need for solar cells (harvesting only visible light) or electrical energy storage.

SUMMARY

Applicant recognizes that traditional tools and techniques for harvesting energy by using solar cells rely on a charge transport to an electrode. Use of a charge transport technique is prone to problems such as short life for the charge carriers, possibility of charge recombination before the charges are transported to the electrode, sustainability of a DC current, lower voltage, and similar others. Traditional tools and techniques for converting wavelength of incident photons rely on generating charge carriers from incident light and the transport of these charge carriers, e.g., the DC current, through small dipole antenna structure to emit electromagnetic radiation. However, applicant recognizes that the use of microscopic photoconducting antennas for converting signal wavelength to 8 to 40 microns is dependent on the availability of the DC current. This does not enable the photoconducting antennas based solar cells to harvest infrared radiation.

Applicant further recognizes that it would be desirable to convert the energy harvested from the incident photons and emitting the harvested energy as an electromagnetic field instead of the traditional DC current. Therefore, a need exists to provide improved tools and techniques for efficiently harvesting energy from heat and thermal radiation sources operating below 600 degrees Celsius, absent the disadvantages found in the prior techniques discussed above.

In some embodiments, an apparatus includes a photovoltaic device (PVD) having a quantum dot (QD) array structure that is capable of performing wavelength conversion. The PVD is configured to generate charge carriers from incident photons. An electric field generator is operable to apply an electric field to the PVD. Strength of the electric field is sufficient to cause the charge carriers to transition through a plurality of discrete energy states formed within a corresponding one of a conductive band and a valence band of the QD array structure. The transition of the charge carriers through the plurality of discrete energy states enables the PVD to generate emitted photons being radiated as an electromagnetic wave. A frequency (and hence wavelength) of the emitted photons being radiated as the electromagnetic wave is tunable by configuring physical attributes of the QD array structure and controlling the electric field strength.

An efficient nanocrystal structure based photovoltaic device is disclosed that is operable to harvest energy from infrared sources (operating below 600 degrees Celsius) and emit electromagnetic radiation waves having tunable frequencies at or above the X-band portion of the frequency spectrum (ranging from about 10 gigahertz (GHz) to about 1 terahertz (THz)). The electromagnetic radiation waves may be used directly for radar applications or may be captured and rectified in to a DC current, e.g., by using rectenna structures. The process to generate the DC current, if desired, is free from the need to collect and physically transport the charge carriers to generate DC current. The output voltage of the apparatus is not limited by the energy of the incident photons, thereby enabling the harvesting of electric power generation from heat sources below degrees Celsius. Thus, the illustrative embodiments presented herein provide a simple, reliable, sustainable, and efficient energy conversion apparatus and method that is suitable for use in an aerospace environment.

BRIEF DESCRIPTION OF THE FIGURES

Embodiments of the present invention may be better understood, and their numerous objects, features, and advantages

DETAILED DESCRIPTION

Figure 1:
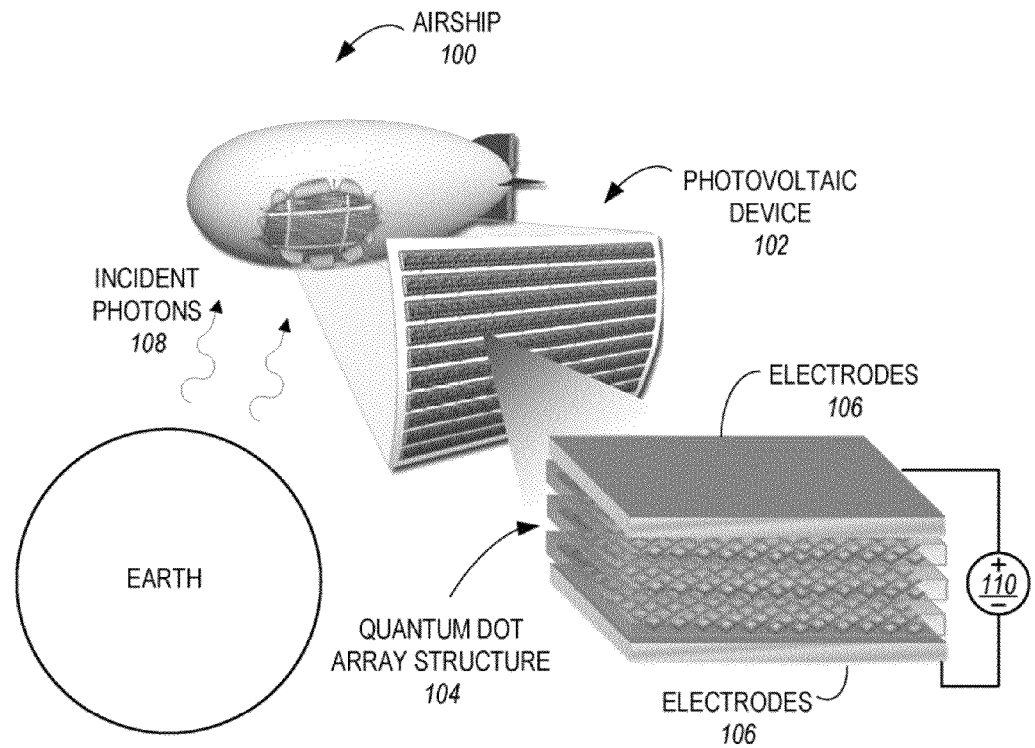
FIG. 1 is a perspective view of an embodiment of an airship configured with a photovoltaic device (PVD) capable of converting heat from the Earth's blackbody radiation to electromagnetic waves and electrical power.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings.

The functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

The following terminology may be useful in understanding the present disclosure. It is to be understood that the terminology described herein is for the purpose of description and should not be regarded as limiting.

Solar cell and photovoltaic cell—A solar cell or photovoltaic cell is a device that converts solar energy into electrical energy in accordance with the photovoltaic effect. While the solar cell and the photovoltaic cell may be used interchangeably, the use of a solar cell in intended to describe harvesting of energy from visible sunlight while the term photovoltaic cell may be used to describe harvesting of energy from any source including sunlight.

Quantum Dot (QD) (also referred to as a nanocrystal)—A light absorbing semiconducting crystal approximately 1-100 nanometers in diameter. The QD confines the motion of conduction band electrons and valence band holes in all three spatial directions by the potential energy barriers that form the QD's boundaries. A structured array of nanocrystals is embedded in a supporting matrix of conductive polymer to form a photovoltaic device (PVD). The PVD can be tuned to absorb or harvest photons having different wavelengths by varying the size and separation between QD's and by selecting the material used to fabricate the QD's.

Configuration—Describes a set up of elements, components, modules, devices, and/or a system, and refers to a process for setting, defining, or selecting particular properties, parameters, or attributes associated with the elements, components, modules, devices, and/or the system. For example, a bias voltage for an electric field may be configured to be equal to V volts in order to generate an electromagnetic wave output having a wavelength of L.

In some embodiments, apparatus and methods disclosed herein provide the ability to harvest the earth's blackbody radiation, also referred to as "earthshine", at night to provide energy to operate a power consuming device around the clock. Various other embodiments disclosed herein can be used to convert into useful energy the waste heat generated by a device such as a jet engine, power plant, laptop computer, a radar, or automobile engine, for more efficient energy consumption and operation. All these devices reject waste heat that can be captured and converted in part to useful work (e.g., electric power) thus cooling the device and increasing its net effective efficiency. The power saved by this recycling strategy can improve the performance of the device, increase its range and endurance, and/or lower the operating costs of the device.

An airship 100 equipped with a photovoltaic device (PVD) 102 having nanocrystals is described with reference to FIG. 1. Additional detail of the PVD 102 is described with reference to FIGS. 2, 3, 4 and 5. The airship 100 equipped with the PVD 102 offers considerable capability in terms of simplicity, reliability, sustainability, and efficiency in energy compared to an airship equipped with traditional solar cells. Such an airship has the ability to operate continuously (e.g., during day and night) and over an extended period of time.

Referring to FIG. 1, useful blackbody radiation from the earth at night at about 65,000 feet altitude is approximately 223 Watts/meter$^2$ (W/m$^2$); this average radiation output reflects both seasonal and geographic variations. During the day, the output rises many-fold from reflected radiation in the form of incident photons 108. In the embodiment shown in FIG. 1, the surface of airship 100 incorporates a photovoltaic device (PVD) 102 having a quantum dot (QD) (also referred to as a nanocrystal) array structure 104. In the depicted embodiment, plurality of layers of quantum dots are arranged in a matrix structure to improve the photon absorption.

The PVD 102 also includes conductors and an electric field generator 110. The electric field generator 110 is operable to generate an electric field across the QD array structure 104 by providing a bias voltage to the pair of electrodes 106, the QD array structure 104 being disposed between the pair of electrodes 106. The electrodes 106 are designed to be transparent to the output electromagnetic waves from the QD array structure 104. The PVD 102 is operable to convert incident heat energy in the form of incident photons 108 having wavelengths ranging from approximately 8 microns to approximately 40 microns into electromagnetic waves (not shown) having frequencies at or above the X-band portion of the frequency spectrum (corresponding to wavelengths of about 30 millimeters to about 30 micrometers). The electromagnetic waves may be rectified to produce DC current for powering on-board electro-mechanical equipment.

The PVD 102 can be tuned to absorb desired wavelengths of the heat or infrared emissions, such as earthshine radiation in the form of incident photons 108, by configuring parameters such as dimension and spacing of the QD's, length of the structure. Additional details of the PVD 102 are described with reference to FIG. 2, FIG. 3, and FIG. 4.

Referring back to FIG. 1, the airship 100 equipped with the PVD 102 is capable of generating power in a sustainable and reliable manner to operate on-board electro-mechanical systems while simultaneously making headway into the wind in order to hold a fixed geostationary position. For example, the PVD 102 subjected to an electric field across the pair of electrodes 106 as disclosed herein, and operating at 75% of the Landsberg efficiency limit, can generate 14.5 W/m². Assuming an airship 100 with a projected area in the earth's direction covered with the QD array structure, the minimum nighttime power production from earthshine is 39 kilowatts (kW) for a 5 million cubic foot vehicle. Such a power level would support a continuous speed rating (referred to as the 'eternal speed') of approximately 43 knots for a typical airship 100 even if none of the energy generated by the PVD 102 is stored. Since the wind at 65,000 feet is typically much less than 43 knots, the excess energy can be stored to operate payloads and other airship functions during high wind events. If the payload does not require much energy, storage is required only for the most stressful wind events, and may not be required at all depending on the system availability requirement. If the airship volume is doubled to 10 million cubic feet, the available power rises to 63 kW, but the eternal speed remains approximately constant because the drag of the vehicle rises with volume almost exactly enough to nullify the increased power output.

Figure 2:
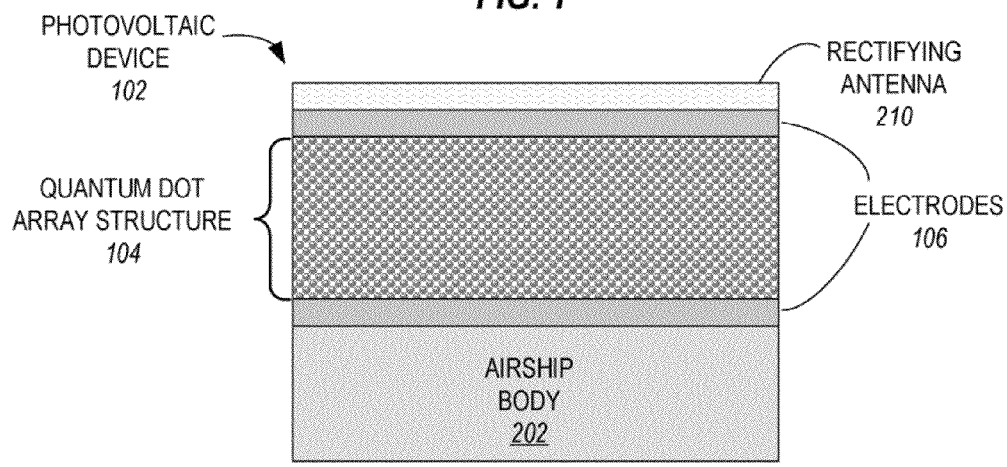
FIG. 2 illustrates an embodiment of cross sectional view of a portion of a PVD having a quantum dot array structure described with reference to FIG. 1.
Figure 3:
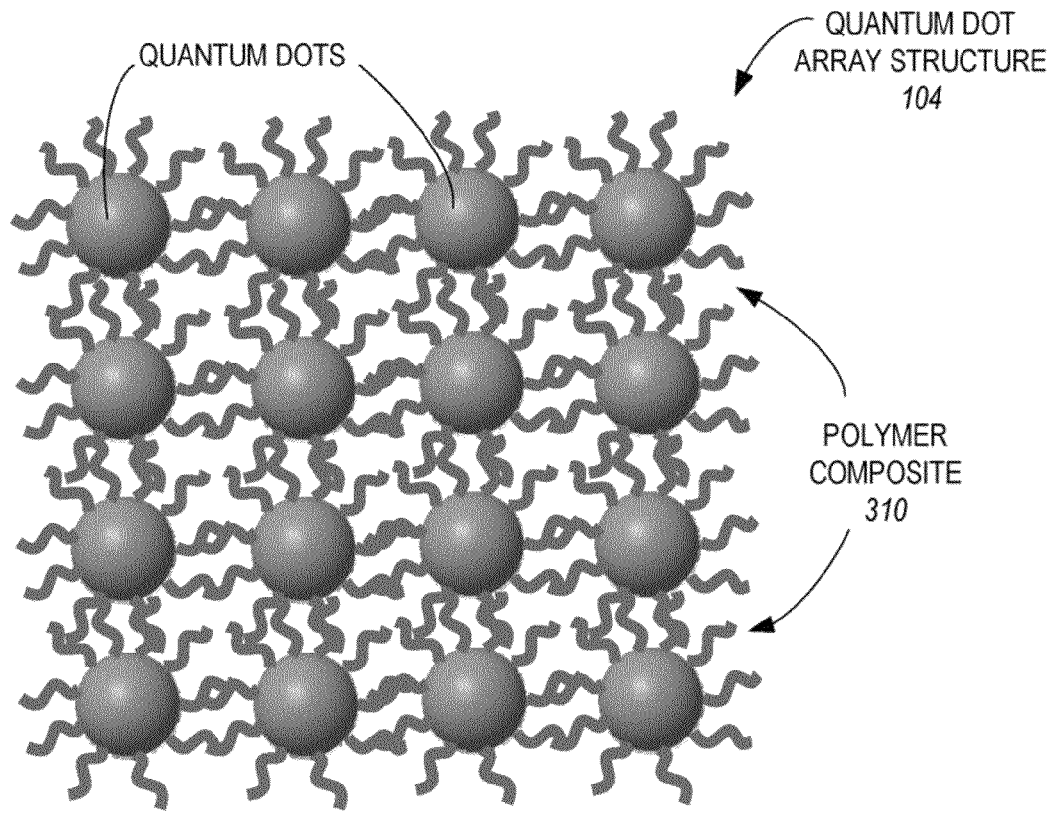
FIG. 3 illustrates an embodiment of a top view of a portion of a quantum dot array structure described with reference to FIG. 1.

FIG. 2 illustrates an embodiment of cross sectional view of a portion of PVD 102 described with reference to FIG. 1. FIG. 3 illustrates an embodiment of a top view of a portion of the QD array structure 104 described with reference to FIG. 1. Referring to FIG. 2 and FIG. 3, the PVD 102 is disposed within a body or hull 202 of the airship 100. The QD array structure 104 included in the PVD 102 is disposed between the pair of electrodes 106. A rectifying antenna 210 device is operable to convert the electromagnetic waves (not shown) emitted by the PVD 102 as an output into a DC power output. An efficiency of the rectifying antenna 210 device may be configured to be at least 90%. In an exemplary, non-depicted embodiment, the rectifying antenna 210 device may include a plurality of diode and dipole elements arranged in a mesh pattern to obtain directional properties. The rectifying antenna 210 device, which may also include filter circuits, may be implemented as a thin film device. Such a thin film antenna may also be rapidly adjusted to match the desired shape, form, or size that optimizes the intended functional and frequency requirements.

The quantum dot (QD) array structure 104 includes a plurality of sheet layers of quantum dots arranged in a matrix structure. The quantum dots have a configurable diameter and are spaced apart at a configurable center-to-center distance between adjacent QD's. The sheet layer thickness and sheet layer length is also configurable. As described earlier, a QD is a light absorbing semiconducting crystal approximately 1-100 nanometers in diameter. The QD confines the motion of conduction band electrons and valence band holes in all three spatial directions by the potential energy barriers that form the QD's boundaries. A structured array of QD's or nanocrystals is embedded in a supporting matrix of conductive polymer composite material 310 to form the PVD 102. The QD array structure 104 can be fabricated through self-assembly or through templated growth.

As described earlier, the PVD 102 is operable to convert incident heat energy having wavelengths ranging from approximately 8 microns to approximately 40 microns into electromagnetic waves having frequencies at or above the X-band portion of the frequency spectrum (corresponding to wavelengths of about 30 millimeters to about 30 micrometers). The PVD 102 can be tuned to absorb incident photons having different wavelengths, e.g., photons between approximately 8 microns to approximately 12 microns emitted by energy sources below approximately 600 degrees Celsius, by varying the size and separation between QD's and by selecting the material used to fabricate the QD's. A frequency of the electromagnetic waves emitted by the PVD 102 as an output is tunable in dependence of strength of an electric field applied. Additional detail of the energy and wavelength conversion feature of the PVD 102 is described with reference to FIG. 4.

Figure 4:
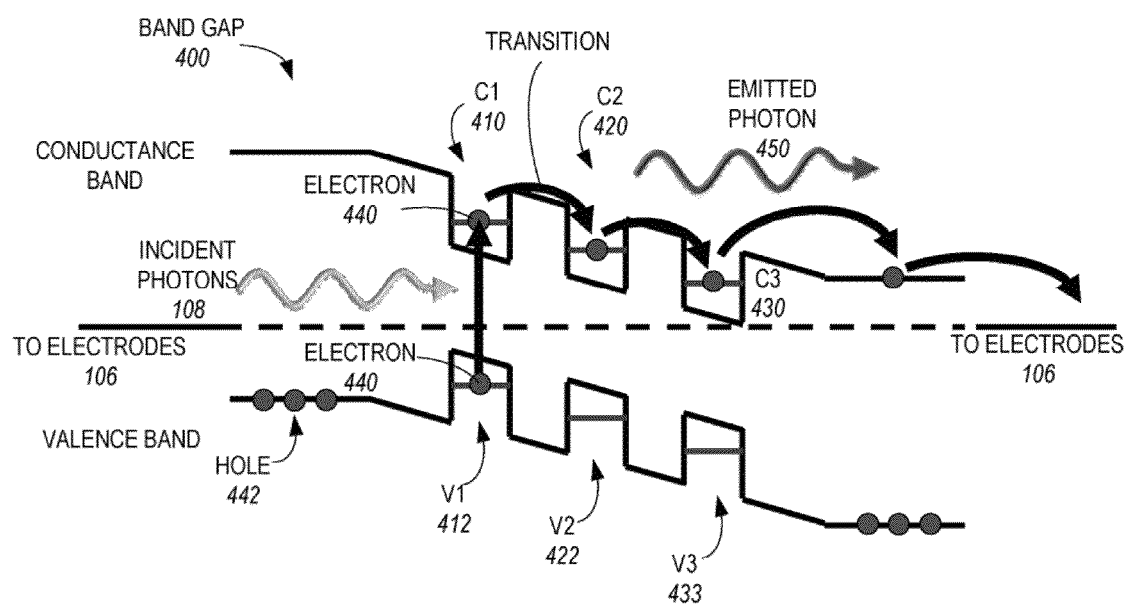
FIG. 4 illustrates an embodiment of an energy band gap associated with a quantum dot described with reference to FIG. 1, FIG. 2, and FIG. 3.

FIG. 4 illustrates an embodiment of an energy band gap 400 associated with a quantum dot described with reference to FIG. 1, FIG. 2 and FIG. 3. The band gap for bulk semiconductors separates the valence band from the more energetic conduction band, making it difficult for electrons to jump to the conduction band. In a regular semiconductor crystal, the band gap is fixed (e.g., about 0.1 electron volt (eV) to 1.0 eV for most semiconductors) owing to continuous energy states. In a quantum dot or nanocrystal, the band gap 400 is present in discrete energy states (C1 410, C2 420, C3 430 in the conduction band, and V1 412, V2 422, V3 432 in the valence band) and is dependent on the size of the nanocrystal. The greater the number of atoms in a nanocrystal, the smaller the distance between discrete energy states. It is understood that the actual number of discrete energy states may be different than shown. The band gap 400 may be altered to produce a range of discrete energy states between the valence and conduction band. For example, the addition or subtraction of one atom or electron to the nanocrystal measurably changes the energy of the band gap.

The incident photons 108 are absorbed by a quantum dot causing at least one electron 440 to be excited. A corresponding hole (or absence of electron) 442 is also generated in the valence band. The electron 440 and the hole 442 may be individually or collectively referred to as a charge carrier. The combination of the electron 440 and the hole 442 is referred as an exciton. The absorbed energy enables the electron 440 to cross the band gap from V1 412 discrete energy state to C1 410 discrete energy state provided the amount of energy absorbed is sufficient to cross the band gap. A presence of the electric field between the pair of electrodes 106 tilts (e.g., having a downward slope) the band gap 400, effectively reducing the energy required to release the electron 440 into the current. In the conductance band, adjacent discrete energy states have a decreasing energy level, e.g., C1 410>C2 420>C3 430. The electron 440 and the hole 442 travel in opposing directions towards the respective electrode. In an absence of the electric field, the downward slope for the band gap is zero.

As the electron 440 travels from one QD to an adjacent QD in the presence of the electric field, a transition occurs from C1 410 to the C2 420 discrete energy state, and then from C2 420 to the C3 430 discrete energy state. Each one of the transitions of the electron 440 causes an emitted photon 450 to be generated. Similarly, as the hole 442 travels from one QD to an adjacent QD in the presence of the electric field, a transition occurs from V3 432 to the V2 422 discrete energy state, and then from V2 422 to the V1 412 discrete energy state. Each one of the transitions of the hole 442 causes another emitted photon to be generated. In a particular embodiment, a number of the emitted photons are greater than a number of the incident photons by a factor of at least 2× (one each for electron and hole transition). Thus, each electron crossing the band gap 400 is capable of generating multiple ones of the emitted photon 450 depending on a number of transitions between the discrete energy states, thereby improving the gain and the efficiency of the PVD 102. In addition, the charge carriers are harvested as the emitted photons before the charge carriers are captured by the electrodes 106. Furthermore, no energy is harvested from the electric field for generating multiple ones of the emitted photon 450. The electric field is only used to reduce the band gap over which the electron 440 must jump to get into the conduction band. Thus, the electric field is not depleted or diminished in the wavelength conversion process.

Multiple ones of the emitted photon 450 are emitted or radiated as an electromagnetic wave having frequency/wavelength that is tunable as a function of the bias voltage applied to the pair of electrodes 106. The bias voltage provides a linear shift in the energies of adjacent nanocrystals, so the wavelength of the emitted photon 450 is linearly proportional to the applied bias voltage. Equation 100 defines a relationship between a frequency of the emitted electromagnetic wave and the bias voltage.

$$h*f\_out = e*V\_bias*d/L = e*E\_bias*d \qquad 100$$

where f_out is the output photon frequency, h is Planck's constant, e is the electron charge, V_bias is the bias voltage, d is the center-to-center spacing of the nanocrystals (measured in the direction parallel to the applied electric field), and L is the total length of the sample. The equation assumes that there is no built-in field arising from a graded impurity concentration in the supporting matrix of conductive polymer composite material 310 or substrate (as in a semiconductor p-n junction).

In a particular embodiment, multiple ones of the emitted photon 450 are emitted or radiated as an electromagnetic wave having a frequency at or above the X-band portion of the frequency spectrum (ranging from about 10 GHz to about 1 THz), which corresponds to wavelength of about 30 millimeters to about 30 micrometers. In a particular embodiment, the frequency of the output electromagnetic wave may be configured to be at least 1 THz but less than 10 THz. To achieve the selective emission at desired frequencies, the QD array structure 104 of the PVD 102 is tuned to absorb infrared photons by generating a gap in the phonon band structure. A phonon is a quantized mode of vibration occurring in a nanocrystal lattice structure, e.g., the QD array structure 104 of the PVD 102. Additional details of the gap in the phonon band structure for passing the desired frequencies, e.g., at or above the X-band, are described with reference to FIG. 5.

The emitted electromagnetic wave may be used directly (without conversion to electrical power) for on-board applications such as radar. In addition, the option of directly converting incident light or heat energy into RF or THz radiation opens up a range of low-power sensor applications. As described earlier, the DC power required for on-board equipment may be generated by the rectifying antenna 210. Therefore, the process to generate the DC current, if desired, is free from the need to collect and physically transport the charge carriers to the electrodes to generate the DC current. The PVD 102 achieves energy and wavelength conversion before the charge carriers reach the electrodes 106. In addition, the output voltage of the PVD 102 is determined by how the emitted photons are used and not limited by the energy of the incident photons.

Figure 5:
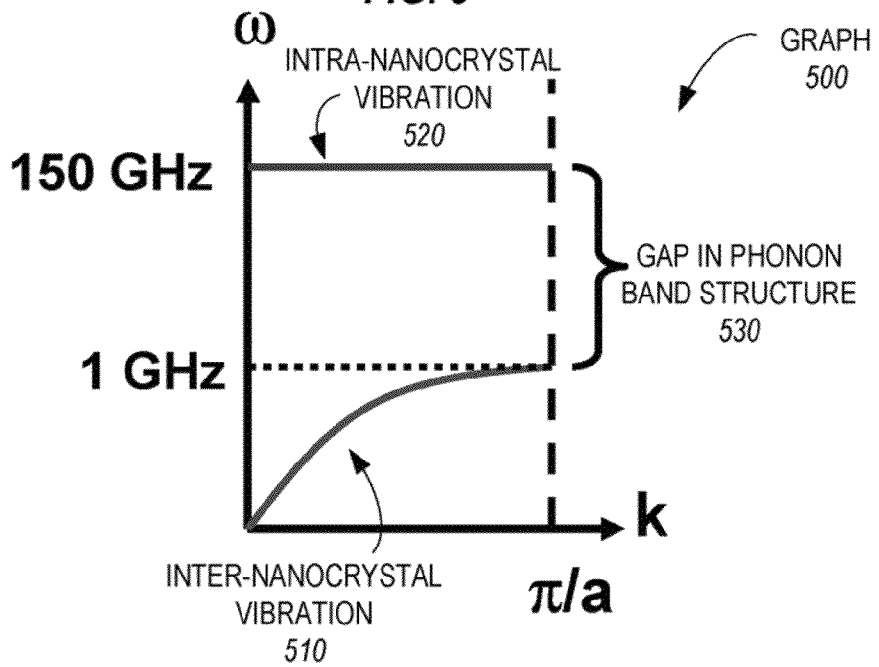
FIG. 5 illustrates an embodiment of a frequency response graph for vibrations occurring in the quantum dot array structure of a PVD described with reference to FIG. 1, FIG. 2, FIG. 3, and FIG. 4.

FIG. 5 illustrates a frequency response graph 500 for vibrations occurring in the QD array structure 104 of the PVD 102 described with reference to FIG. 1, FIG. 2, FIG. 3, and FIG. 4, according to an embodiment. The QD array structure 104 vibrates in response to the incident photons 108, the vibrations being in accordance with a phonon band structure for the QD array structure 104. The phonon band structure is configurable to suppress the transition that causes energy loss due to the vibrations instead of harvesting energy as the emitted photons. The phonon band structure includes a gap at the configurable frequency (or a configurable range of frequencies) of the electromagnetic wave output. The phonon gap opened up by the QD array structure 104 of the PVD 102 increases the lifetime of the excited states and enables multiple GHz/THz photons to be emitted for each incident photon.

In the confined nanocrystal geometry of the QD array structure 104, the bulk acoustic phonons are split into two groups: the low frequency group (illustrated by Y-axis of the graph 500) that results in an overall translation of the nanocrystal (nanocrystal "acoustic" phonons), and a higher frequency group (not shown) that includes vibrations within the nanocrystal (nanocrystal "optical" phonons). The bulk optical phonons are still active, but lie much higher in frequency (10's of THz instead of GHz). Thus, the absorption of incident photons 108 on the QD's causes the QD's to generate an inter-nanocrystal vibration 510 having a frequency less than approximately 1 GHz and an intra-nanocrystal vibration 520 having a frequency equal to 150 GHz. A gap 530 in the phonon band structure, e.g., between 1 GHz and 150 GHz, is beneficial to photon emission when the charge carriers transition and travel between nanocrystals because there are no non-radiative channels in which to dissipate energy. The gap 530 in the phonon band structure is achieved due to confinement of bulk acoustic phonons in the nanocrystal geometry, and the soft conductive polymer composite material 310 in which the nanocrystals are embedded. Since the nanocrystals are effectively zero-dimensional, there is no need for phonon emission to accompany photon emission to conserve momentum. Since the phonon band gap is readily achieved in close-packed nanocrystal colloidal crystals, there is no conflict between phonon band gap formation and charge carrier movement. Absorbed infrared radiation is down-converted and re-emitted as electromagnetic wave (GHz/THz) radiation instead of being absorbed by the nanocrystals and converted into heat (phonons).

Figure 6:
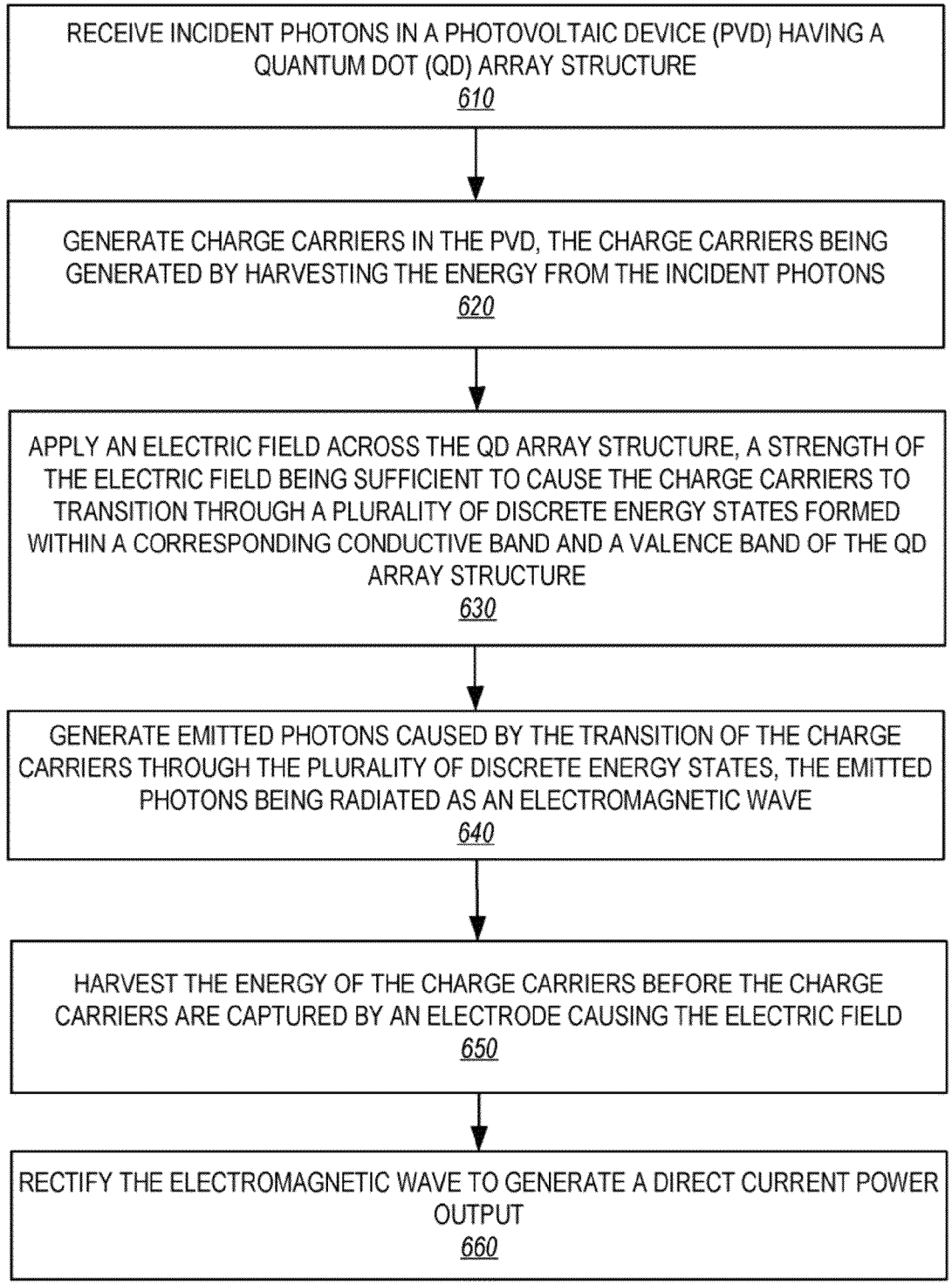
FIG. 6 is a flow chart of a method for harvesting energy from incident photons, according to an embodiment.

FIG. 6 is a flow chart of a method for harvesting energy from incident photons, according to an embodiment. In a particular embodiment, the method may be used to harvest energy from incident photons using the PVD 102 described with reference to FIGS. 1, 2, 3, 4 and 5. At step 610, incident photons are received by a photovoltaic device (PVD) having a quantum dot (QD) array structure. At step 620, charge carriers are generated in the PVD by harvesting the energy from the incident photons. At step 630, an electric field is applied across the QD array structure. Strength of the electric field is sufficient to cause the charge carriers to transition through a plurality of discrete energy states formed within a corresponding conductive band and a valence band of the QD array structure. At step 640, emitted photons are generated. The emitted photons are caused by the transition of the charge carriers through the plurality of discrete energy states. The emitted photons are radiated as an electromagnetic wave having a tunable wavelength and frequency. At step 650, harvesting of the energy contained within the charge carriers is completed before the charge carriers are captured by the electrodes. At step 660, the electromagnetic wave radiated as an output is rectified to generate a DC power output. It is understood, that various steps described above may be added, omitted, combined, altered, or performed in different orders. For example, step 660 may be omitted if the PVD is used in radar applications that may not require DC power.

Embodiments disclosed herein provide an efficient nanocrystal structure based photovoltaic device that is operable to harvest energy from infrared sources (operating below 600 degrees Celsius) and emit electromagnetic radiation waves having tunable frequencies at or above the X-band portion of the frequency spectrum (ranging from about 10 GHz to about 1 THz). The electromagnetic radiation waves may be used directly for radar applications or may be captured and rectified into a DC current, e.g., by using rectenna structures. The process to generate the DC current, if desired, is free from the need to collect and physically transport the charge carriers to generate DC current. The output voltage of the apparatus is not limited by the energy of the incident photons, thereby enabling the harvesting of electric power generation from heat sources below degrees Celsius. Thus, the illustrative embodiments presented herein provide a simple, reliable, sustainable, and efficient energy conversion apparatus and method that is suitable for use in an aerospace environment.

While the present disclosure describes various embodiments, these embodiments are to be understood as illustrative and do not limit the claim scope. Many variations, modifications, additions and improvements of the described embodiments are possible. For example, those having ordinary skill in the art will readily implement the processes necessary to provide the structures and methods disclosed herein. Variations and modifications of the embodiments disclosed herein may also be made while remaining within the scope of the following claims. The functionality and combinations of functionality of the individual modules can be any appropriate functionality. In the claims, unless otherwise indicated the article "a" is to refer to "one or more than one".

I claim:

1. An apparatus comprising:
a photovoltaic device (PVD) including a quantum dot (QD) array structure, wherein the QD array structure is configured to generate charge carriers from incident photons; and
an electric field generator coupled to the QD array structure and configured to apply an electric field to the QD array structure, the electric field configured to cause the charge carriers to transition through a plurality of discrete energy states formed within a corresponding one of a conductive band and a valence band of the QD array structure, the transition of the charge carriers through the plurality of discrete energy states enabling the QD array structure to generate emitted photons at the conductive and valence bands as an electromagnetic wave having a specified frequency; and
a rectifying antenna operable to convert the electromagnetic wave having a frequency greater than 1 terahertz (THz) up to 10 THz into a direct current power output,
wherein:
the electric field generator comprises a first electrode and a second electrode, the first electrode and second electrode being operable to provide a bias voltage to control a configurable wavelength of the emitted photons,
the QD array structure being disposed between the first electrode and the second electrode, wherein the first electrode and the second electrode are on opposite sides of the QD array structure, and
the rectifying antenna is in direct physical contact with the first electrode.

2. The apparatus of claim 1, wherein the QD array structure is configured to generate the emitted photons based on a transition of a charge carrier from one discrete energy state to an adjacent discrete energy state.

3. The apparatus of claim 1, wherein the QD array structure is configured to generate the emitted photons based on energy harvested from the charge carriers before the charge carriers are captured by one or more of the first and second electrodes of the electric field generator.

4. The apparatus of claim 1, wherein the QD array structure comprises a plurality of quantum dots arranged in stacked sheet layers in a matrix structure.

5. The apparatus of claim 4, wherein the QD array structure is embedded in a polymer composite of the matrix structure.

6. The apparatus of claim 1, wherein the incident photons have a wavelength in a range of 8 microns to 40 microns.

7. The apparatus of claim 6, wherein the emitted photons have a wavelength in a range of 30 millimeters to 30 micrometers.

8. The apparatus of claim 1, wherein the specified frequency is based on at least one of a size of a quantum dot included in the QD array structure, a distance between adjacent quantum dots included in the QD array structure, a thickness of the QD array structure formed as a sheet layer, and a length of the sheet layer.

9. The apparatus of claim 1, wherein the specified frequency is in a range of 10 gigahertz to 1 terahertz.

10. The apparatus of claim 1, wherein the QD array structure vibrates in response to the incident photons, the vibrations being in accordance with a phonon band structure for the QD array structure, the phonon band structure including a frequency gap at the specified frequency.

11. The apparatus of claim 10, wherein the phonon band structure is configured to suppress the transition that causes the vibrations instead of harvesting energy for the emitted photons.

12. The apparatus of claim 1, wherein the incident photons are generated by heat sources having a temperature below 600 degrees Celsius.

13. The apparatus of claim 1, wherein a number of the emitted photons is greater than a number of the incident photons by a factor of at least 2.

14. The apparatus of claim 1, wherein the apparatus is equipped within an airship.

15. A method for harvesting energy from incident photons, the method comprising:
receiving the incident photons in a photovoltaic device (PVD) including a quantum dot (QD) array structure;
generating charge carriers in the PVD, the charge carriers being generated by harvesting the energy from the incident photons;
applying, by an electric field generator coupled to the QD array structure, an electric field across the QD array structure, the electric field being configured to cause the charge carriers to transition through a plurality of discrete energy states formed within a corresponding conductive band and a valence band of the QD array structure;
generating emitted photons from energy harvested from the charge carriers transitioning through the plurality of discrete energy states, the emitted photons being radiated as an electromagnetic wave having a specified frequency; and
rectifying, by a rectifying antenna, the electromagnetic wave having a frequency greater than 1 terahertz (THz) up to 10 THz to generate a direct current power output,
wherein:
the electric field generator comprises a first electrode and a second electrode, the first electrode and second electrode being operable to provide a bias voltage to control a configurable wavelength of the emitted photons,
the QD array structure being disposed between the first electrode and the second electrode, wherein the first electrode and the second electrode are on opposite sides of the QD array structure, and the rectifying antenna is in direct physical contact with the first electrode.

16. The method of claim 15, further comprising:

harvesting the energy of the charge carriers before the charge carriers are captured by one or more of the first and second electrodes in the PVD causing the electric field.

17. The method of claim 15, wherein the incident photons originate from heat sources having a temperature below 600 degrees Celsius.

18. The method of claim 15, wherein a number of the emitted photons is greater than a number of the incident photons by a factor of at least two, and wherein the incident photons have a wavelength that is different from a wavelength of the emitted photons.

\* \* \* \* \*